United States Patent
Jelinek et al.

[19]

[11] Patent Number: 6,163,226
[45] Date of Patent: Dec. 19, 2000

[54] CURRENT-CONTROLLED P-CHANNEL TRANSISTOR-BASED RING OSCILLATOR

[75] Inventors: Jules Joseph Jelinek, San Francisco; Michael Arthur Brown, San Jose; Ramin Shirani, Morgan Hill, all of Calif.

[73] Assignee: Lucent Technologies, Inc., Murray Hill, N.J.

[21] Appl. No.: 09/318,481

[22] Filed: May 25, 1999

Related U.S. Application Data

[60] Provisional application No. 60/087,600, Jun. 1, 1998.

[51] Int. Cl.[7] .................................................. H03B 5/02
[52] U.S. Cl. ......................................... 331/57; 331/177 R
[58] Field of Search ............................ 331/57, 34, 177 R

[56] References Cited

U.S. PATENT DOCUMENTS 5,847,616  12/1998  Ng et al. ..................................... 331/57

*Primary Examiner*—Siegfried H. Grimm
*Attorney, Agent, or Firm*—Patrick T. King

[57] ABSTRACT

A current-controlled oscillator (ICO) circuit including an all p-channel transistor based ring oscillator, a first current mirroring stage, and a second current mirroring stage. The all p-channel transistor based ring oscillator, p-channel transistors in the input structure of each amplification stage, and metal lines in the ring and from the ring to the amplification stages over an n-well improve noise immunity and tolerance. The first current mirroring stage utilizes an input current to generate a first voltage controlling a series of differential delay cells connected in a ring topology that forms the ring oscillator. The second mirroring stage utilizes a precision current to generate a second voltage controlling at least one amplification stage, which converts corresponding delay cell output signals to a single-ended logic level signal compatible with external circuitry needs. Each amplification stages utilizes the second control voltage to create a similar or ratioed copy of the precision current flowing in each amplification stage. A second embodiment of the ICO is also included, which operates at a lower frequency, thus higher bandwidth, than that of the first embodiment.

13 Claims, 9 Drawing Sheets

CURRENT-CONTROLLED P-CHANNEL TRANSISTOR-BASED RING OSCILLATOR

CROSS-REFERENCES TO RELATED APPLICATION

This application claims the benefit of U.S. Provisional Patent Application Ser. No. 60/087,600, filed Jun. 1, 1998.

BACKGROUND OF THE INVENTION

1. Technical Field

This invention relates generally to oscillators, and more particularly to a current-controlled oscillator (ICO) with noise isolation feature.

2. Discussion of Background Art

Voltage controlled oscillators (VCOs) normally comprise a voltage-to-current converter circuit providing a current to control a current-controlled oscillator (ICO). ICOs, or VCOs as a whole, are susceptible to noise asserted from neighboring integrated circuits through the process substrate (or bulk) forming the transistors in ICOs. A Metal-Oxide Semiconductor (MOS) transistor includes a source, a drain, and a gate where the conductivity of the transistor is determined by a voltage $V_{GS}$ across the gate and the source. This voltage $V_{GS}$ determines the transistor's electrical performance because it determines the amount of current flowing through the transistor. Noise, or unwanted random electrical modulation of the substrate under the gate of a transistor, effects voltage $V_{GS}$ and causes the transistor to change its electrical behavior intended for its function.

Prior art solutions deal with ICO's noise problems based on the substrate resistivity because the substrate resistance permits noise to proliferate. Low resistivity substrates attenuate noise to a lesser extent than high resistivity substrates. One solution to deal with low resistivity substrates provides an unused area around the ICO circuitry, to create a barrier preventing noise from being injected into the ICO. Another solution provides either a p-channel or an n-channel ring serving as noise containment. This solution thus requires additional circuitry on the die comprising the ICO. Further, as current sub-micron technologies move towards low resistivity substrates, such solutions for high resistivity substrates become obsolete.

Most MOS processes include p-subtrates and n-wells. A solution dealing with noise in low resistivity substrates employs an n-channel isolation (n-ISO) technique, which provides a p-well inside an n-well, thus allows n-channels in a p-well inside an n-well. However, this n-well ISO technique requires an additional process step that takes an extra lithography step to put the p-well inside the n-well, which not only increases process cost and manufacturing time but also results in higher chances of low product yields.

Therefore, what is needed is ICO designs with noise immunity circuitry that overcomes prior art deficiencies.

SUMMARY OF THE INVENTION

The present invention provides a current-controlled oscillator (ICO) circuit with high tolerance to noise generated by other circuitry. The ICO circuit includes, in each delay cell of the ring oscillator, all p-channel differential transistor pairs in the active switching path driving all-p channel transistor loads serving as inputs in each amplifier stage. Additionally, a current source in the ring oscillator feeding the delay cells also includes p-channel transistors. All of these p-channel transistors in an n-well avoid noise injected from other circuitry on the same semiconductor die comprising the ICO. Metal connections from one delay cell to its corresponding amplification stage and to another delay cell also reduce noise by being routed over the n-well. In effect, the ring oscillator uses an n-well on the die so that the substrate cannot couple noise to the P-channel transistors, nor the connections in the ring, nor the connections from the ring to the inputs of the amplification stages.

A first current mirroring stage in the ICO utilizes a current $I_{in}$ to generate a first control voltage $V_{out}$, representative of a ratioed version of current $I_{in}$, or current $I_{in}$ itself. This voltage $V_{out}$ then controls a series of delay cells connected to form an all p-channel ring oscillator circuit. Each delay cell utilizes $V_{out}$ to create a similar or ratioed copy of $I_{in}$ flowing in each delay cell.

Similarly, a second current mirroring stage in the ICO utilizes a precision reference current $I_{ref}$ to generate a second voltage $V_{amp}$, representative of the precision reference current $I_{ref}$, or a ratioed version of this current $I_{ref}$. This voltage $V_{amp}$ then controls one or more amplification stages, which convert corresponding delay cell output signals to a single-ended logic level signal compatible with external circuitry needs. Each amplification stage utilizes $V_{amp}$ to create a similar or ratioed copy of the precision reference current $I_{ref}$ flowing in each amplification stage. These amplification stages also include an all p-channel transistor input structure.

Two preferred embodiments of the ICO circuit are included. The first embodiment includes one output pair and operates at a higher frequency, thus lower bandwidth while the second embodiment includes eight output pairs and operates at a lower frequency, thus higher bandwidth.

DETAILED DESCRIPTION OF THE PREFERRED EMBODIMENT

Figure 1:
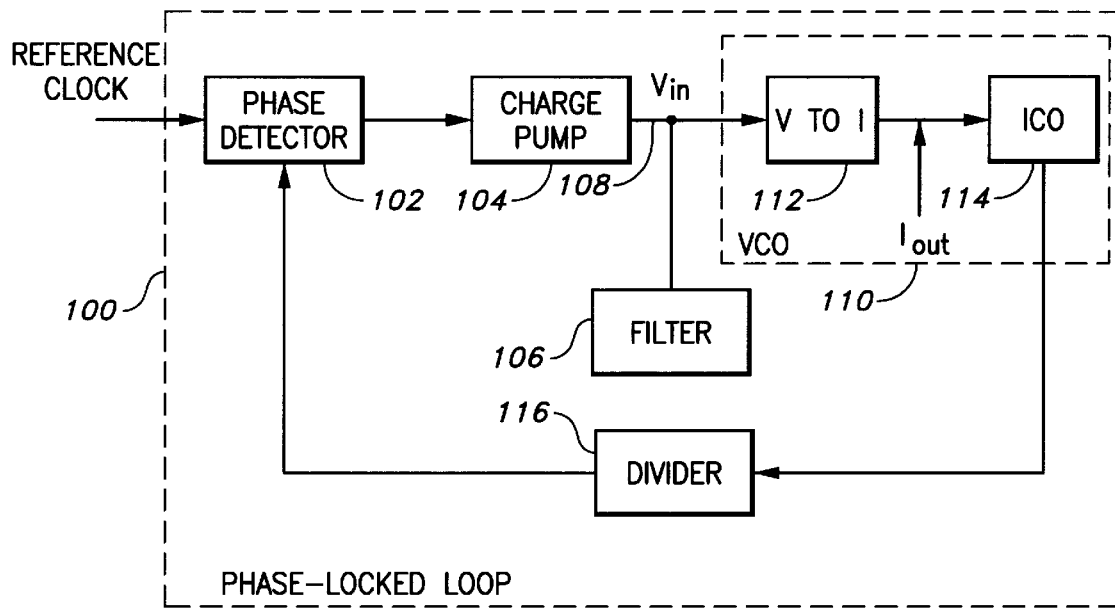
FIG. 1 is a block diagram showing a Phase-Locked Loop (PLL) where an ICO is generally found applicable.

FIG. 1 shows a Phase-Locked Loop (PLL) 100 where the ICO of the present invention is generally applicable. PLL 100 includes a phase detector 102 that receives a reference clock input (ref clock) and feeds a charge pump 104 coupled to a filter 106. Filter 106 provides a voltage $V_{in}$ 108 to a VCO 110. VCO 110 includes a V-to-I converter 112 and an ICO 114, and provides the frequency output to a divider 116, which provides feedback to phase detector 102.

The present invention is directed to an ICO 114 having two preferred embodiments. The first embodiment includes one output pair and operates at a higher frequency, thus lower bandwidth, while the second embodiment includes eight output pairs and operates at a lower frequency, thus higher bandwidth.

Figure 2B:
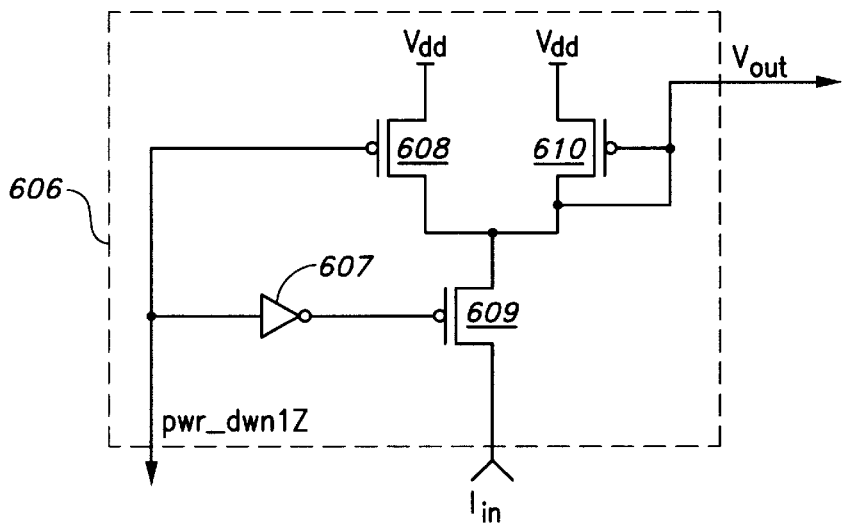
FIG. 2B shows a preferred embodiment of first current mirroring stage 606 of FIG. 2A.
Figure 2A:
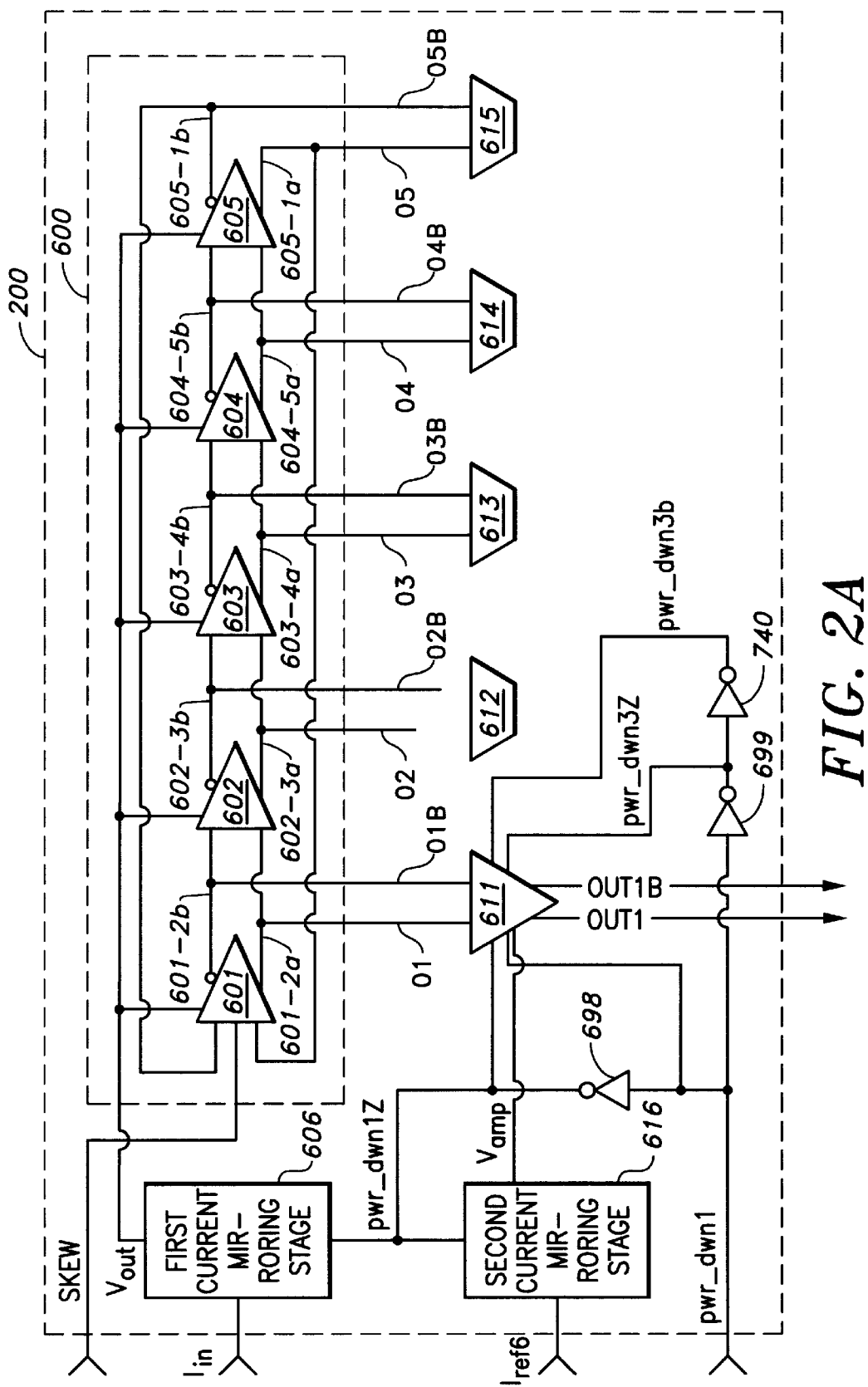
FIG. 2A shows a block diagram of ICO 200, a first embodiment of ICO 114 of FIG. 1.

FIG. 2A shows a block diagram of an ICO 200 which is a first preferred embodiment of ICO 114. ICO 200 includes a first current mirroring stage 606; a second current mirroring stage 616; a five stage ring oscillator comprising delay cells 601, 602, 603, 604, and 605; an amplifier stage 611; additional amplifier stages 612, 613, 614, and 615; and components for power down and enable controls. ICO 200 receives as inputs a current $I_{in}$, a current $I_{ref6}$, and a digital power down and enable signal pwr_dwn1. Current $I_{in}$ is preferably one of a current $I_{out}$ provided from a voltage-to-current converter circuit, which is a subject of a co-pending patent application Ser. No. 09/318,511, filed May 25, 1999, entitled "Voltage-to-Current Converter Circuit with Independent and Adjustable Compensation for Process, Voltage, and Temperature," which is filed by the same inventors as the present application and which is hereby incorporated by reference. Current $I_{ref6}$ is preferably of a precision type, such as that provided by a band gap circuit, also disclosed in the incorporated co-pending application. However, a variation of about 10% to 15% would be sufficiently precise in accordance with the invention. ICO 200, when enabled, outputs a clock OUT1 and an inverted clock OUT1B.

First current mirroring stage 606 generates a corresponding first reference voltage $V_{out}$ from input current $I_{in}$. This reference voltage $V_{out}$ is then utilized by delay cells 601, 602, 603, 604, and 605 to establish an approximately equal supply current in each differential delay cell.

Delay cells 601, 602, 603, 604, and 605 form a ring oscillator 600. First delay cell 601 is skewable. Delay cells 602, 603, 604, and 605 are preferably identical in function and design to delay cell 601 except that a portion of the circuitry provided to skew the output signal levels of delay cell 601 has been removed.

Since cells 602, 603, 604, and 605 are preferably similar in function and design, the transistor level connections (FIG. 2C) at lines 601-2a and 601-2b are similar to those at respective lines 602-3a and 602-3b, 603-4a and 603-4b, 604-5a and 604-5b, and 605-1a and 605-1b. Similarly, the transistor level connections (FIG. 2C) at lines O1 and O1B are similar to those at respective lines O2 and O2B, O3 and O3B, O4 and O4B, and O5 and O5B. Metal lines 601-2a, 601-2b, 602-3a, 602-3b, 603-4a, 603-4b, 604-5a, 604-5b, 605-1a, 605-2a, O1, O1B, O2, O2B, O3, O3B, O4, O4B, O5, and O5B are over an n-well, thus reduce noise because the substrate forming the transistors does not capacitively couple noise onto those lines.

Second current mirroring stage 616 generates a second reference voltage $V_{amp}$, which is utilized by amplification stage 611. This voltage $V_{amp}$, in combination with transistors (680 and 690) of FIG. 2E, provides two approximately equal currents to amplification stage 611, which provides output signals OUT1 and OUT1B.

Stages 612–615 are added so that each of corresponding delay cells 602–605 has the same capacitive load as delay cell 601 having capacitive load from stage 611.

Power down and enable controls include input signal pwr_dwn1 and three inverters 698, 699, and 740 that create signals pwr_dwn1z, pwr_dwn3z, and pwr_dwn3b, respectively. These signals control transistors that either pull nodes to a supply potential or block the flow of current such that the circuitry of ICO 200 consumes little or no power when power down mode is enabled.

FIG. 2B shows a preferred embodiment of current mirroring stage 606 of FIG. 2A, including an inverter 607 and three transistors 608, 609, and 610. Transistor 609 acts like a spacer with diode connected transistor 610 establishing first reference voltage $V_{out}$. Transistor 609 also acts as a digitally controlled switch enabling transistor 610 to conduct current when ICO 200 is not disabled in power down mode. Similarly, transistor 608 disables $V_{out}$ by pulling $V_{out}$ to supply voltage Vdd when in power down mode.

Figure 2C:
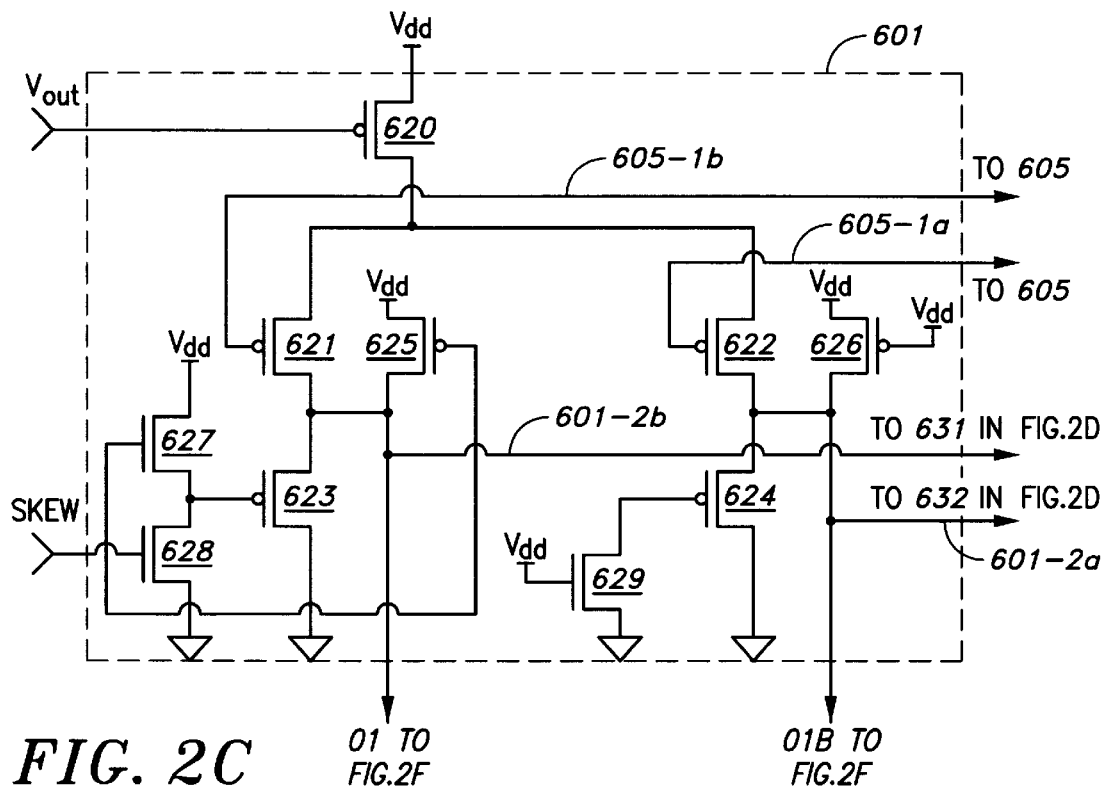
FIG. 2C shows a preferred embodiment of delay cell 601 of FIG. 2A.

FIG. 2C shows a preferred embodiment of first delay cell 601, which includes transistors 620, 621, 622, 623, 624, 625, 626, 627, 628, and 629. Transistor 620 is a p-channel current sourcing transistor. P-channel transistors 620, 621, 622, 623, and 624 form the switching path in cell 601, and none of them is in the P substrate/bulk. They are in an n-well, isolated from other circuitry on the semiconductor die, to improve noise immunity. $V_{out}$ in combination with transistor 620 provides a current to the differential transistor pair 621 and 622. Load transistors 623 and 624 provide a load to differential pair 621 and 622 along with any load provided by parasitic transistor source, drain, and gate capacitances and signal line interconnect capacitances on lines O1 and O1B. Transistors 628 and 629 provide an electronically symmetrical ground connection for the gates of respective transistors 623 and 624 when the skew signal is not activated. Thus, when the skew signal is not activated, load transistors 623 and 624 are diode-connected transistors.

When the skew input is active (preferably grounded), transistor 623 is turned off with transistor 627 pulling the gate of transistor 623 to the supply voltage (Vdd). This allows transistor 625 to pull O1 towards the supply voltage maintaining output O1 at a higher potential than output O1B and placing the ICO outputs in a deterministic static state. Transistor 626 balances the parasitic drain capacitance added by the incorporation of transistor 625 into skewable delay cell 601. On start-up, the skew signal is utilized to induce an offset into the delay cell based ring oscillator to guarantee the beginning of oscillatory behavior upon its de-assertion. Transistors 625 and 626 are also p-channels.

Figure 2D:
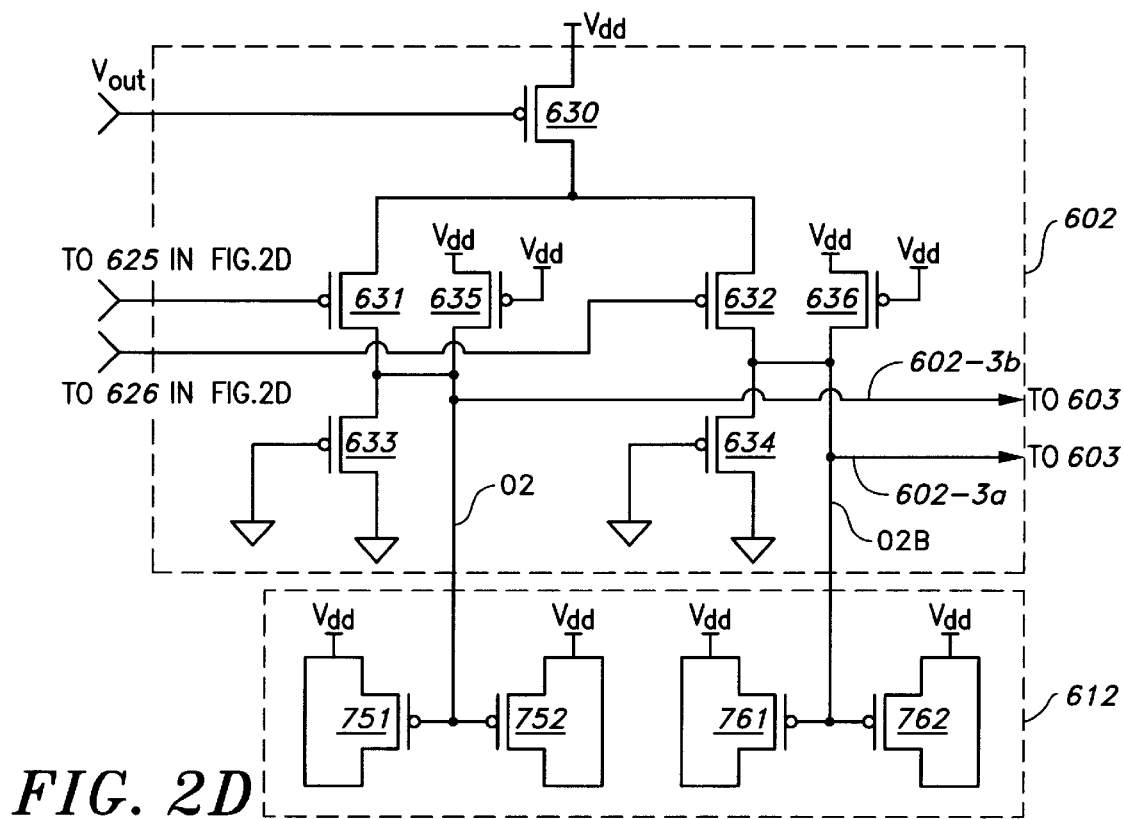
FIG. 2D shows a preferred embodiment of delay cell 602 of FIG. 2A being connected to a preferred embodiment stage 612.
Figure 2E:
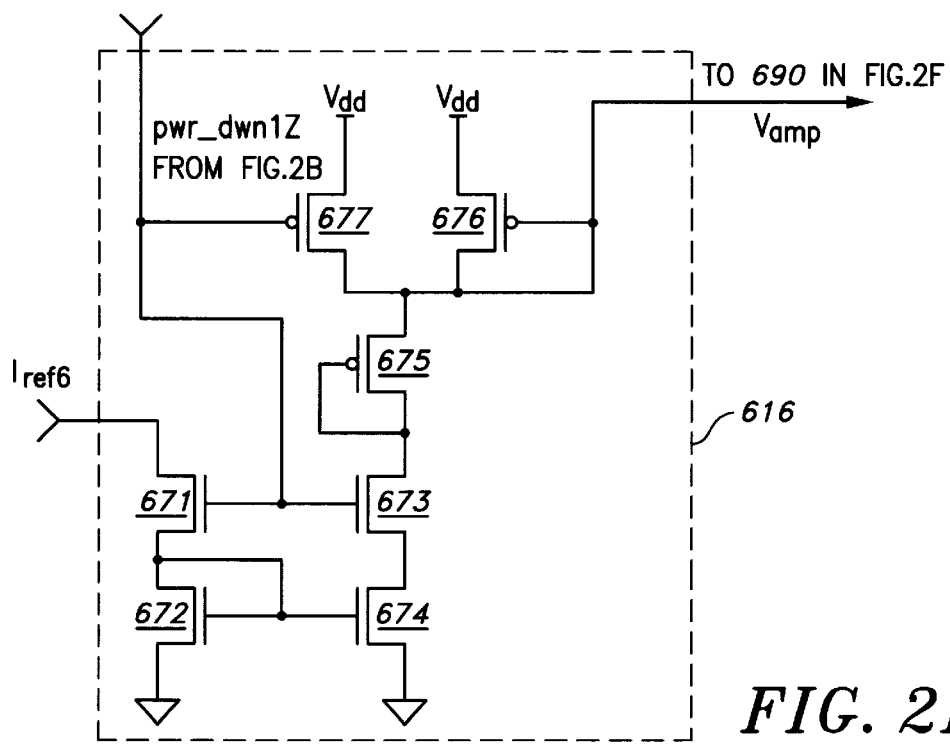
FIG. 2E shows a preferred embodiment of second current mirroring stage 616 of FIG. 2A.

FIG. 2D shows a preferred embodiment of delay cell 602 coupled to a preferred embodiment of stage 612. Delay cells 603, 604, and 605, connected to respective stages 613, 614, and 615, include similar embodiments. Each of delay cells 602, 603, 604, and 605 is preferably identical in function and design to delay cell 601, except that transistors 627, 628, and 629 of FIG. 2C provided to skew the output signal levels of delay cell 601 have been removed.

As in delay cell 601 and by analogy in delay cell 602, $V_{out}$ in combination with transistor 630 provides a current to input differential transistor pair 631 and 632. Transistor 630 is a p-channel current sourcing transistor. P-channel transistors 630, 631, 632, 633, and 634 form a switching path. Load transistors 633 and 634 provide a diode-connected transistor load to differential pair 631 and 632 along with the load provided by any parasitic transistor source, drain, and gate capacitances and signal line interconnect capacitances on lines O2 and O2B. Transistors 635 and 636 are for parasitic drain capacitance matching on lines O2 and O2B.

Since cells 602, 603, 604, and 605 are similar in function and design, the connections at lines 602-3a and 602-3b from cell 602 to cell 603 are similar as those at lines 601-2a and 601-2b from cell 601 (FIG. 2C) to cell 602 (FIG. 2D). Similarly, there exist the same connections (not shown) from cell 603 to cell 604, cell 604 to cell 605, and cell 605 to cell 601.

Stage 612 includes two transistor pairs 751 and 752 and 761 and 762 having similar functions as respective transistor pairs 685 and 686 and 693 and 694 (FIG. 2F), and will be discussed in conjunction with FIG. 2F. These transistor pairs act a load balance so that each stage 611, 612, 613, 614, and 615 (of FIG. 2A) has similar capacitive loading.

FIG. 2E shows a preferred embodiment circuit of current mirroring stage 616. This stage 616 creates voltage $V_{amp}$ from precision current $I_{ref6}$, using transistors 671, 672, 673, 674, 675, 676, and 677. Transistors 671 and 673 function as switches enabling current $I_{ref6}$ to be mirrored by transistors 672 and 674 into spacer transistor 675 and $V_{amp}$ voltage determining transistor 676. When transistors 671 and 673 are turned off transistor 677 is turned on pulling node voltage $V_{amp}$ to the voltage supply potential and turning transistor 676 off.

Figure 2F:
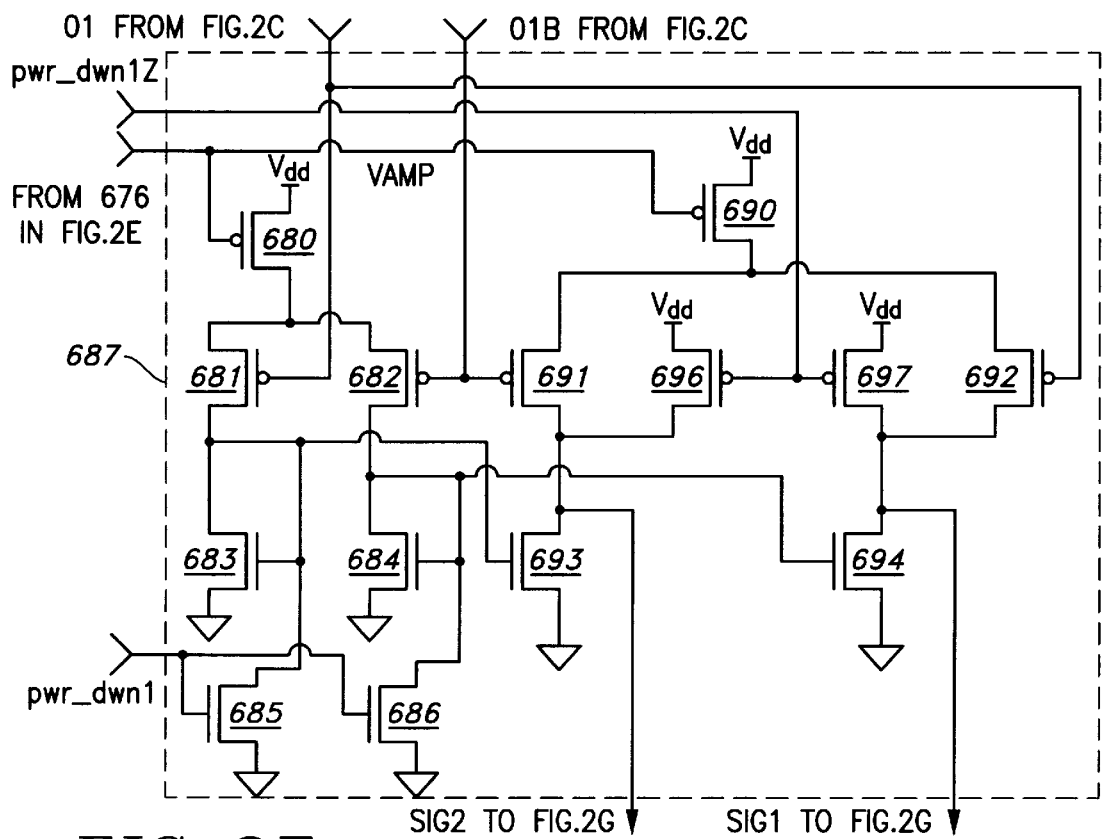
FIG. 2F shows a preferred embodiment of amplification stage 687 in stage 611 of FIG. 2A.
Figure 2G:
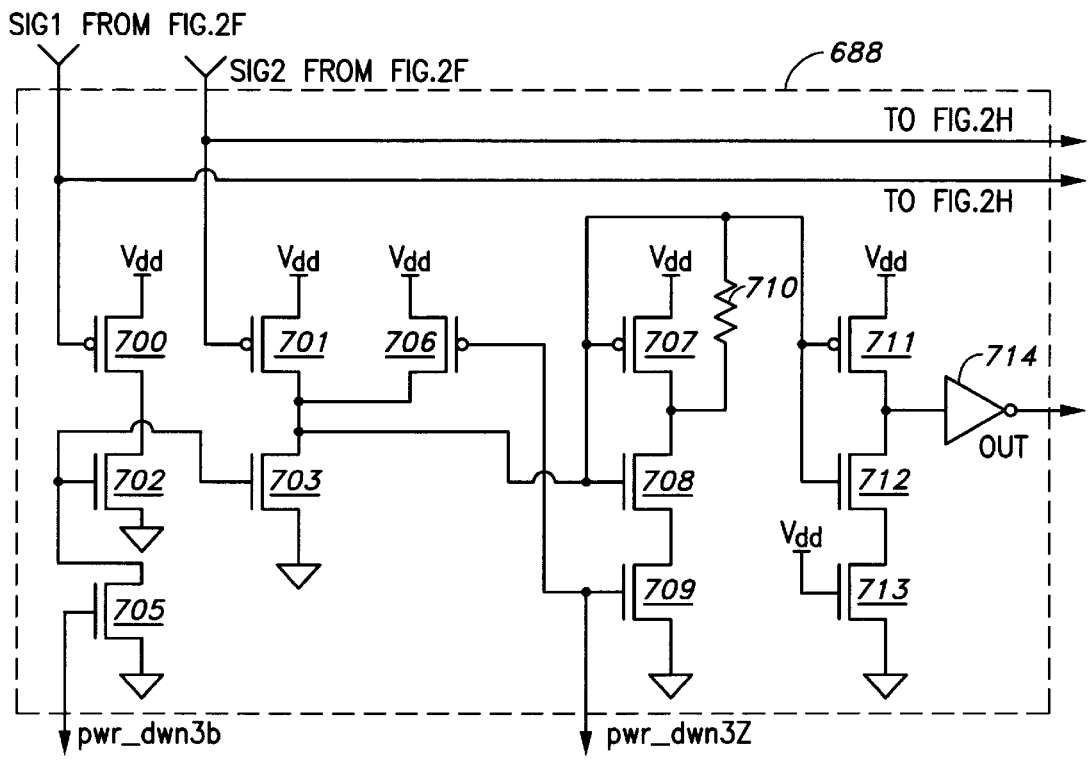
FIG. 2G shows a preferred embodiment of converter 688 in stage 611 of FIG. 2A.
Figure 2H:
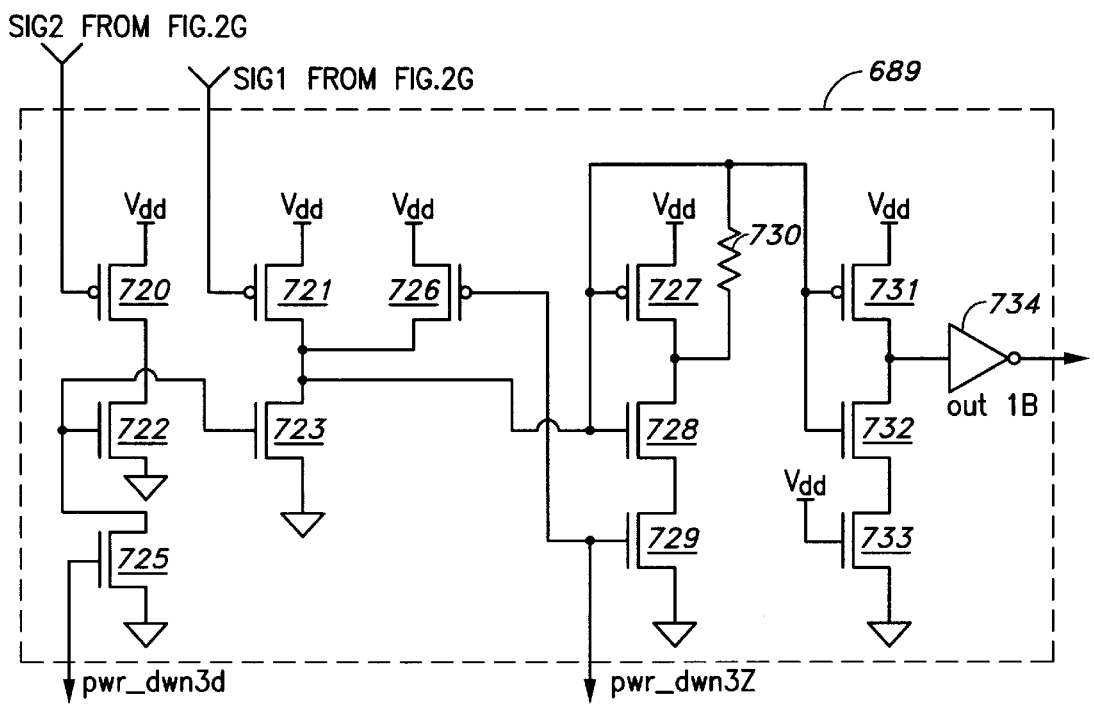
FIG. 2H shows a preferred embodiment of converter 689 in stage 611 of FIG. 2A.

FIGS. 2F–H show preferred circuits that form an embodiment of amplifier stage 611, including a push-pull amplification stage 687 (FIG. 2F) and two single end converters 688 and 689 (FIGS. 2G and 2H, respectively). The outputs (sig1 and sig2 in FIG. 2F) of push-pull amplification stage 687 drive two converters 688 and 689 with swapped inputs. These converters provide speed while maintaining the duty cycle accuracy of the single ended output signals OUT1 and OUT1B.

FIG. 2F shows a preferred embodiment of push-pull amplification stage 687, comprising transistors 680, 681, 682, 683, 684, 685, 686, 690, 691, 692, 693, 694, 696 and 697. Signals O1 and O1B from delay cell 601 drive two respective differential transistor pairs 681 and 682, and 691 and 692 that form a p-channel input structure for stage 611. Since input transistor pairs 681 and 682 and 691 and 692 are all p-channels, push-pull amplification stage 687 and the substrate that is used to build the transistors are limited in their ability to inject noise backwards into delay cell 601. Therefore, ICO 200 has improved noise immunity and tolerance. Had input transistors 681, 682, 691, and 692 been n-channels, these n-channels would be capacitively modulated by their $V_{GS}$ voltage and inject noise into ring oscillator 600.

First differential transistor pair 681 and 682 drive diode-connected load transistors 683 and 684. These load transistors 683 and 684 then determine the operating point voltages of load transistors 693 and 694 for second differential load transistor pair 691 and 692. Since the connections to transistors 681 and 682 are connected in an opposite manner to transistors 691 and 692, push-pull amplification stage 687 has higher gain and thus higher bandwidth due to the push-pull action formed by such connections. Transistors 685, 686, 696, and 697, along with transistors 671, 673, 676, and 677 (FIG. 2E) of second current mirroring stage 616, provide a method for disabling push-pull amplification stage 687 so that little or no current is consumed by this part of the circuitry in power down mode.

FIG. 2G shows a preferred circuit of first single end converter 688, comprising transistors 700, 701, 702, 703, 705, 706, 707, 708, 709, 711, 712, and 713, resistor 710, and inverter 714. The voltages on sig1 and sig2 are converted into currents by the respective voltages on the gates of transistors 700 and 701. The current in transistor 700 is then mirrored and connected in opposition to the current flowing in transistor 701 by transistors 702 and 703. The resulting current imbalance is injected into a voltage reference established by transistors 707, 708, and 709 and resistor 710. When transistor 700 conducts more current than transistor 701, the voltage at the gate of transistors 707, 708, 711, and 712 will be pulled towards ground. Similarly, when transistor 700 conducts less current than transistor 701, that same voltage is pulled towards the supply voltage. By designing the output inverter made up of transistors 711, 712, and 713 to have similar device sizes to those of transistors 707, 708, and 709, the trip point remains similar with the duty cycle of the resulting waveform at the drain of transistors 711 and 712 being well preserved. Inverter 714 buffers and provides greater drive strength to output signal OUT1 in order to minimize load induced distortion.

Transistors 705, 706, and 709 provide a disable or power down mode. When transistor 709 is active, the voltage bias circuit formed by transistors 707, 708, and 709 and resistor 710 is fully operational. Transistor 713 provides a matching voltage drop to transistor 709 to minimize any additional duty cycle distortion from being induced into the output signal. Similarly, transistor 705 turns off transistors 702 and 703 when disabled so that transistor 706 can pull the input node to transistors 707, 708, 711, and 712 to the supply voltage.

FIG. 2H shows a preferred embodiment of converter circuit 689. Similar to converter circuit 688, converter 689 comprises transistors 720, 727, 728, 729, 731, 732, and 733, resistor 730, and inverter 734. The difference between converters 688 and 689 is the analogous input transistors 720 and 721 are connected in a cross coupled manner to those of input transistors 700 and 701. This results in output OUT1B being an approximately inverted version of output OUT1.

Figure 3A:
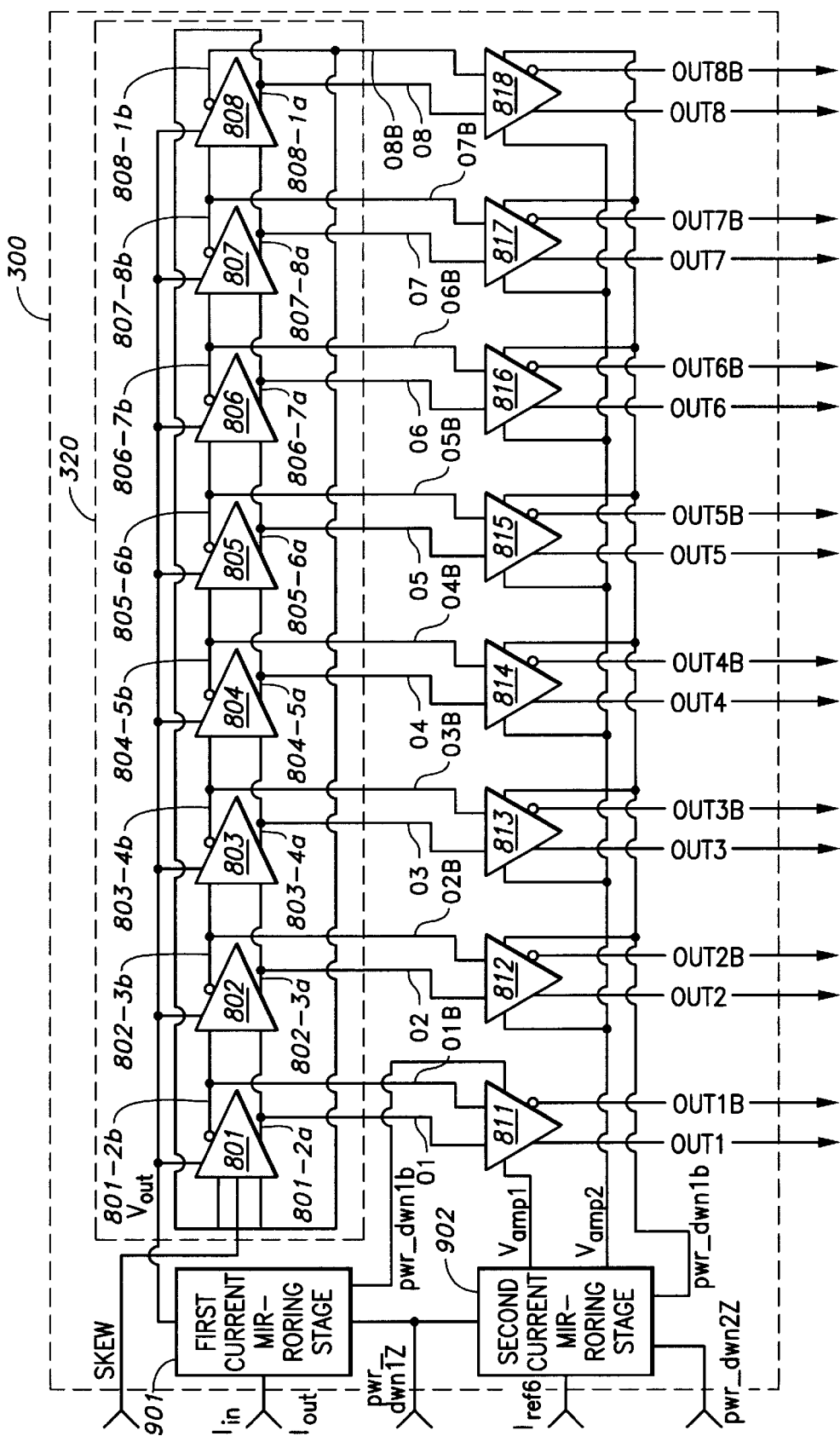
FIG. 3A shows a block diagram of ICO 300, a second embodiment of ICO 114 of FIG. 1.

FIG. 3A shows a block diagram of an ICO 300, a second preferred embodiment of ICO 114, which includes a first current mirroring stage 901; a second current mirroring stage 902; an eight stage ring oscillator comprising delay cells 801, 802, 803, 804, 805, 806, 807, and 808; and amplifier stages 811, 812, 813, 814, 815, 816, 817, and 818. ICO 300 receives a current $I_{in}$, a current $I_{ref6}$, and digital power down and enable signals pwr_dwn1z and pwr_dwn2z. Current $I_{in}$ is preferably one of a current $I_{out}$ provided from a voltage-to-current converter circuit, which is a subject of a co-pending and incorporated by reference application title "Voltage-to-Current Converter Circuit with Independent and Adjustable Compensation for Process, Voltage, and Temperature". Current $I_{ref6}$ is preferably of a precision type, such as that provided by a band gap, also disclosed in the incorporated co-pending application. However, a variation of about 10% to 15% would be sufficiently precise in accordance with the invention.

ICO 300, when enabled, outputs sixteen clock signals, identified by their generating stages as OUT1 and OUT1B through OUT8 and OUT8B. Functionally, these output clock signals provide approximately equally spaced clocks varying in phase position by 360 degrees divided by n. In this embodiment, the output clock signals provide sixteen clock signals 22.50 degrees apart in phase relationship when used in the following order: OUT1, OUT2B, OUT3, OUT4B, OUT5, OUT6B, OUT7, OUT8B, OUT1B, OUT2, OUT3B, OUT4, OUT5B, OUT6, OUT7B, and OUT8.

First current mirroring stage 901 generates a corresponding first reference voltage $V_{out}$, which is then utilized by delay cells 801, 802, 803, 804, 805, 806, 807, and 808 to establish an approximately equal supply current in each differential delay cell.

Delay cells 801, 802, 803, 804, 805, 806, 807, and 808 form a ring oscillator 800. Delay cells 801 is skewable. Delay cells 802, 803, 804, 805, 806, 807, and 808 are preferably identical in function and design to delay cell 801 except that the circuitry (transistors 827, 828, and 829 in FIG. 3C) provided to skew the output signal levels of delay cell 801 has been removed.

Since cells 802, 803, 804, 805, 806, 807, and 808 are preferably similar in function and design, the transistor level connections (FIG. 3C) at lines 801-2a and 801-2b are similar to those at respective lines 802-3a and 802-3b, 803-4a and 803-4b, 804-5a and 804-5b, 805-6a and 805-6b, 806-7a and 806-7b, 807-8a and 807-8b, and 807-1a and 807-1b. Similarly, the transistor level connections (FIG. 3C) at lines O1 and O1B are similar to those at respective lines O2 and O2B, O3 and O3B, O4 and O4B, O5 and O5B, O6 and O6B, O7 and O7B, and O8 and O8B. Metal lines 801-2a, 801-2b, 802-3a, 802-3b, 803-4a, 803-4b, 804-5a, 804-5b, 805-6a, 805-6b, 806-7a, 806-7b, 807-8a, 807-8b, 808-1a, 808-1b, O1, O1B, O2, O2B, O3, O3B, O4, O4B, O5, O5B, O6, O6B, O7, O7B, O8, and O8B are over an n-well, thus reduce noise because the substrate forming the transistors does not capacitively couple noise onto those lines.

Delay cells 801–808 are laid out in such a way that the run length from one cell to another cell is equal, enabling uniform phases between the cells.

Second current mirroring stage 902 generates two additional reference voltages $V_{amp1}$ and $V_{amp2}$, which are utilized by amplification stage 811 and amplification stages 812, 813, 814, 815, 816, 817, and 818, respectively. A preferred schematic representation of these identical amplification stages 812–818 is provided in FIG. 3F. This second current mirroring stage 902 creates voltage $V_{amp1}$, which, in combination with transistors (880 and 890 in FIG. 3F) in stage 811 provides two approximately equal currents in dual amplification stage 811. Similarly, second current mirroring stage 902 also creates voltage $V_{amp2}$, which in combination with transistors 880 and 890 in stages 812 through 818 respectively, provides an additional fourteen approximately equal currents in dual amplification stages 812 through 818.

ICO 300 in FIG. 3A operates at a lower frequency than that of ICO 200 in FIG. 2A when delay cells 601, 602, 603, 604, and 605 have similar device sizing to that of delay cells 801, 802, 803, 804, 805, 806, 807, and 808. Thus, the bandwidth of dual amplification stage 811 is lower than that of push-pull amplification stage 687. This results in dual amplification stage 811 being more energy efficient than push-pull amplification stage 687.

Additionally, ICO 300 does not need to use additional stages 612, 613, 614, and 615 since every delay cell stage 812–818 of ICO 300 drives its own dual amplification stage. In applications where not all equally positioned phase output signals are required, stages similar to stage 612 of ICO 200 can be used to replace the corresponding dual amplification stages in FIG. 3A. This will result in a further power consumption efficiency.

Pwr_dwn1z input signal enables and powers down first current mirroring stage 901, a portion of second mirroring stage 902, and, through $V_{out}$ going to the supply voltage, ICO ring oscillator stages 801, 802, 803, 804, 805, 806, 807, and 808. When enabled, the ring oscillator can oscillate and feedback through stage 811 and divider 116 (FIG. 1) to phase detector 102 (FIG. 1).

Pwr_dwn2z enables and powers down amplification stages 812, 813, 814, 815, 816, 817, and 818. When in power down mode, these amplification stages are disabled allowing lower power consumption while PLL 100 (FIG. 1) remains completed and can maintain lock.

Figure 3B:
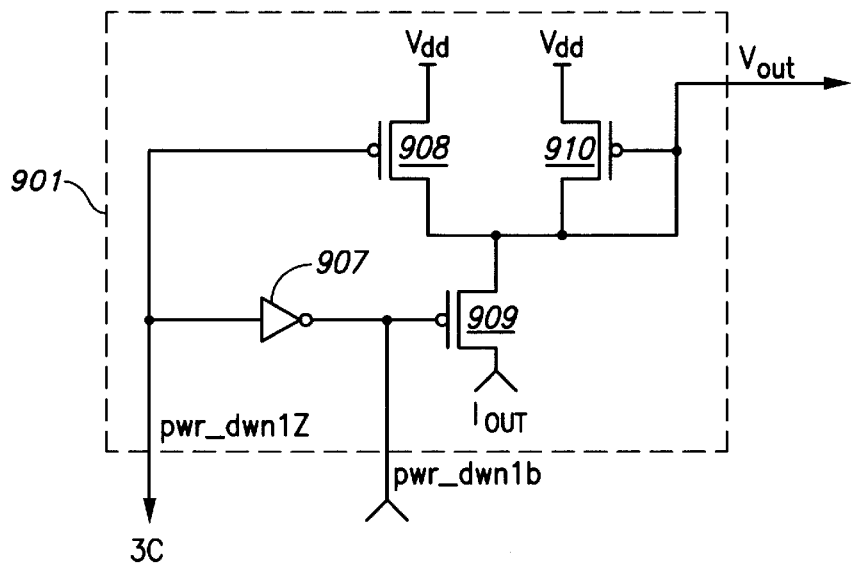
FIG. 3B shows a preferred embodiment of first current mirroring stage 901 of FIG. 3A.

FIG. 3B shows a preferred embodiment of first current mirroring stage 901, which generates a corresponding first reference voltage $V_{out}$ from current $I_{in}$ using inverter 907 and transistors 908, 909, and 910. Transistor 909 acts like a spacer with diode connected transistor 910 establishing first reference voltage $V_{out}$. Transistor 909 also acts as a digitally controlled switch enabling transistor 910 to conduct current when ICO 300 is not disabled in power down mode. Similarly, transistor 908 disables $V_{out}$ by pulling $V_{out}$ to the supply voltage when ICO 300 is in power down mode.

Figure 3C:
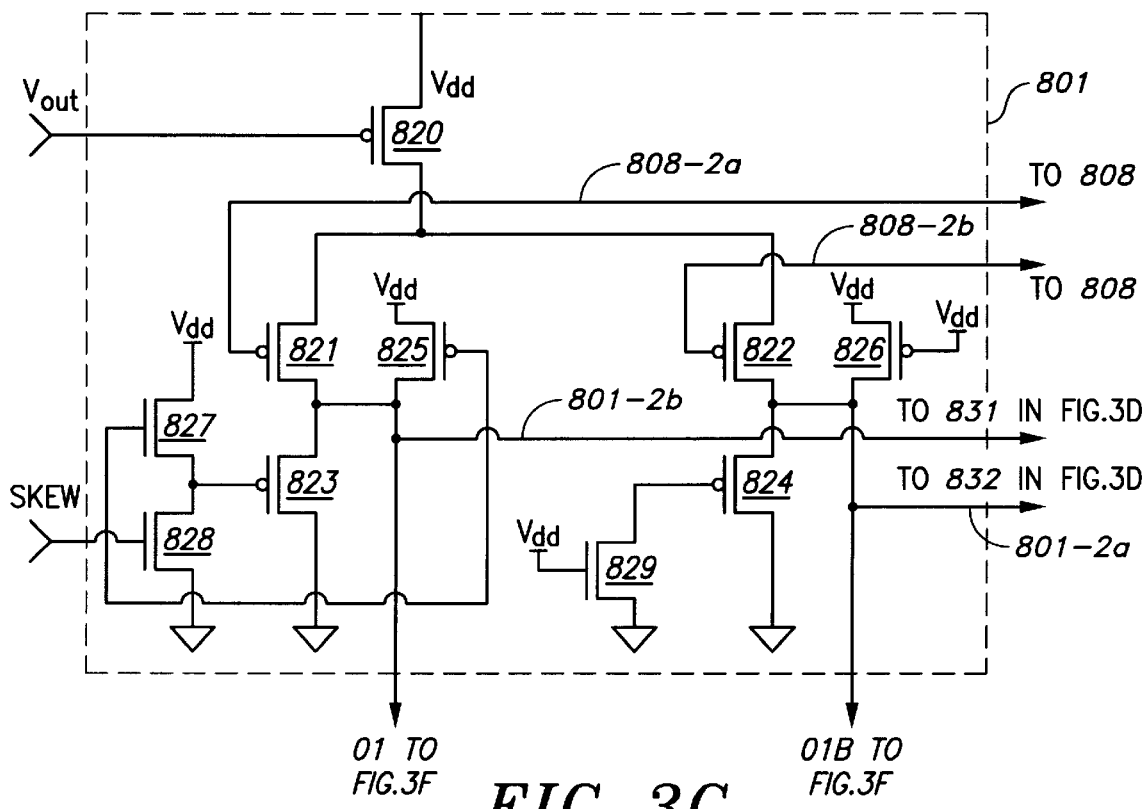
FIG. 3C shows a preferred embodiment of delay cell 801 of FIG. 3A.

FIG. 3C shows a preferred embodiment of delay cell 801, which is a skewable delay cell, including transistors 820, 821, 822, 823, 824, 825, 826, 827, 828, and 829. Transistor 820 is a p-channel current sourcing transistor. P-channel transistors 820, 821, 822, 823, and 824 form the switching path, and none of them is in the p substrate/bulk. They are in an n-well, isolated from other circuitry on the semiconductor die, to improve noise immunity. $V_{out}$ in combination with transistor 820 provides a current to input differential transistor pair 821 and 822. Load transistors 823 and 824 provide a load to differential pair 821 and 822 along with any load provided by parasitic transistor source, drain, and gate capacitances and signal line interconnect capacitances on lines O1 and O1B. Transistors 828 and 829 provide an electronically symmetrical ground connection for the gates of transistors 823 and 824, respectively, when the skew signal is not activated. Thus, when the skew signal is not activated, load transistors 823 and 824 are essentially diode-connected transistors.

When the skew input is active (preferably grounded), transistor 823 is turned off with transistor 827 pulling the gate of transistor 823 to the supply voltage. This allows transistor 825 to pull output O1 towards the supply voltage maintaining output O1 at a higher potential than output O1B and thus preventing ICO 300 from oscillating. Transistor 826 balances the parasitic drain capacitance resulted by the incorporation of transistor 825 into skewable delay cell 801. On start-up, the skew signal is utilized to induce an offset into the delay cell based ring oscillator to guarantee the beginning of oscillatory behavior upon its de-assertion. Transistors 825 and 826 are also p-channel.

Figure 3D:
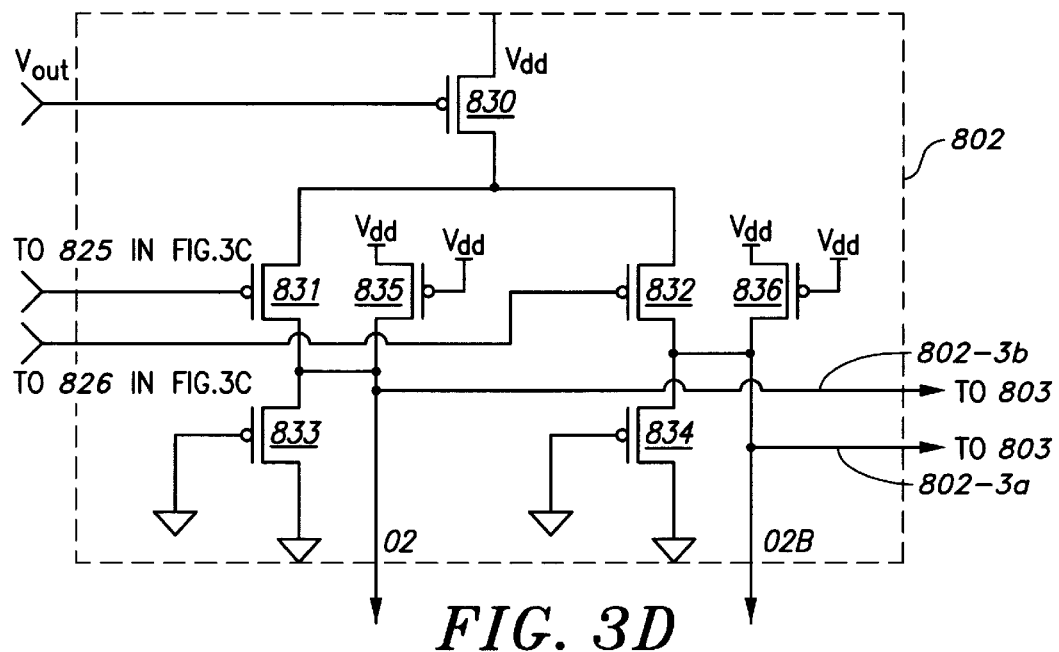
FIG. 3D shows a preferred embodiment of delay cell 802 of FIG. 3A.

FIG. 3D shows a preferred embodiment of cell 802. As in delay cell 801 and by analogy in delay cell 802, $V_{out}$ in combination with transistor 830 provides a current to input differential transistor pair 831 and 832. Transistor 830 is a p-channel current sourcing transistor. P-channel transistors 830, 831, 832, 833, and 834 form a switching path. Load transistors 833 and 834 provide a diode connected transistor load to differential pair 831 and 832 along with the load provided by any parasitic transistor source, drain, and gate capacitances and signal line interconnect capacitances on lines O2 and O2B. Transistors 835 and 836 are for parasitic drain capacitance matching on lines O2 and O2B, respectively.

Since cells 802, 803, 804, 805, 806, 807, and 808 are similar in function and design, the connections at lines 802-3a and 802-3b from cell 802 to cell 803 are similar as those at lines 801-2a and 801-2b from cell 801 (FIG. 3C) to cell 802 (FIG. 3D). Similarly, there exist the same connections (not shown) from cell 803 to cell 804, cell 804 to cell 805, cell 805 to cell 806, cell 806 to cell 807, cell 807 to cell 808, and cell 808 to cell 801.

Figure 3E:
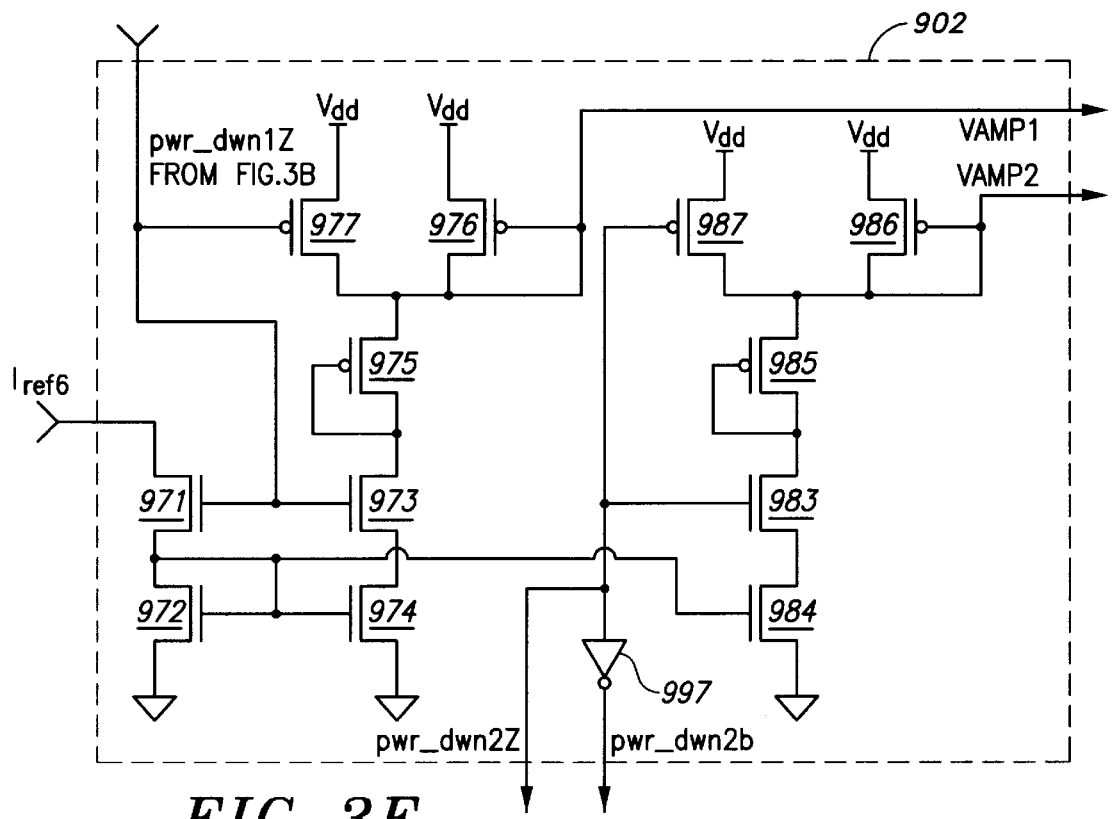
FIG. 3E shows a preferred embodiment of second current mirroring stage 902 of FIG. 3A.

FIG. 3E shows a preferred embodiment of second current mirroring stage 902. This stage creates voltage $V_{amp1}$ from a precision current $I_{ref6}$, using transistors 971, 972, 973, 974, 975, 976, and 977. Transistors 971 and 973 function as switches enabling current $I_{ref6}$ to be mirrored by transistors 972 and 974 into spacer transistor 975 and $V_{amp1}$ voltage determining transistor 976. When the input signal pwr___dwn1 is asserted transistors 971 and 973 are turned off and transistor 977 is turned on pulling node voltage $V_{amp1}$ to the voltage supply potential turning transistor 976 off.

$V_{amp1}$ allows OUT1 and OUT1B to drive the external circuitry when transistor pair 971 and 973 and transistor 977 is disabled. This in turn permits OUT1 to close PLL 100 (FIG. 1) and disable amplification stages 812, 813, 814, 815, 816, 817, and 818 to save power when their respective output signals are not used by external circuitry.

When $V_{amp1}$ is operational and amplification stages 812, 813, 814, 815, 816, 817, and 818 need to become operational, $V_{amp2}$ is enabled through assertion of input signal pwr___dwn2z. Reference voltage $V_{amp2}$ is generated by transistors 983, 984, 985, 986, and 987. Transistor 984 in combination with transistor 972 has the capability to mirror a copy of current $I_{ref6}$. When transistor 983 is turned on and transistor 987 is turned off, current is allowed to flow through transistor 984, transistor 983, spacer transistor 985, and transistor 986, establishing reference voltage $V_{amp2}$.

Figure 3F:
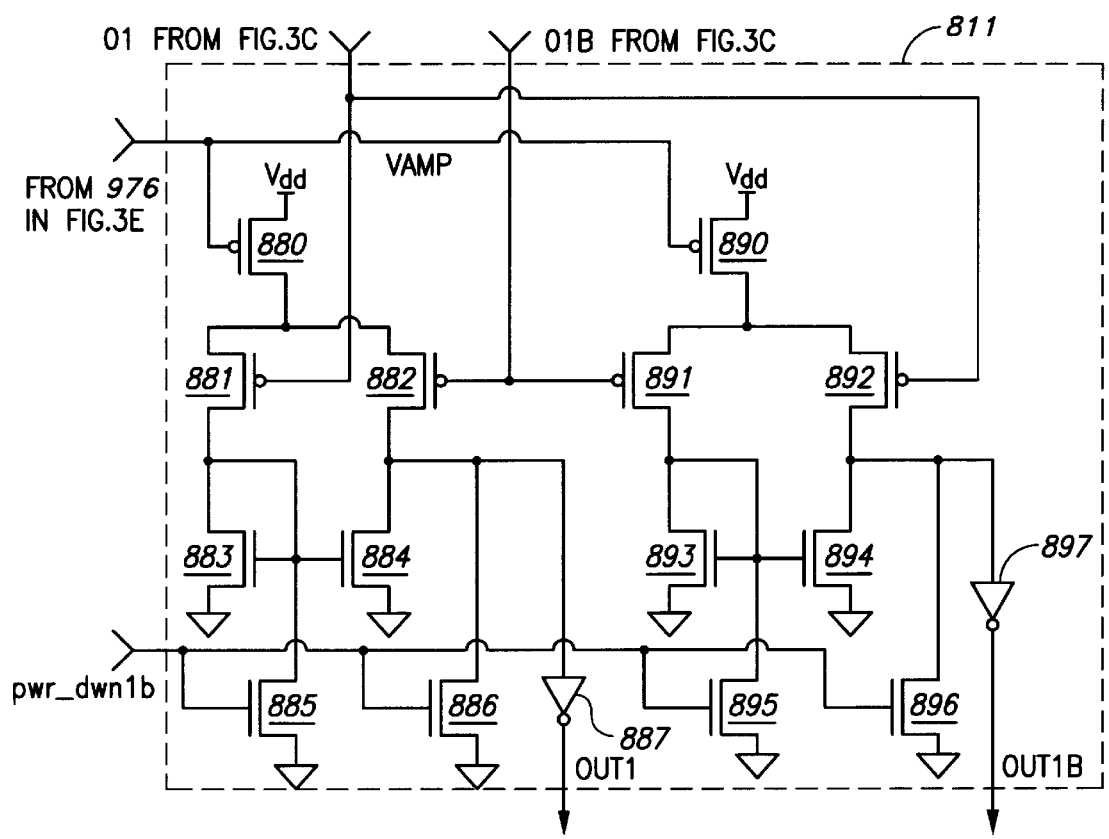
FIG. 3F shows a preferred embodiment of amplification stage 811 of FIG. 3A.

FIG. 3F shows a preferred embodiment of amplification stage 811, comprising transistors 880, 881, 882, 883, 884, 885, 886, 890, 891, 892, 893, 894, 895, 869 and inverters 887 and 897. Signals O1 and O1B from delay cell 801 drive two respective differential transistor pairs 881 and 882, and 892 and 891, that form a p-channel input structure for stage 811. Differential transistor pair 881 and 882 is connected to transistor pair 883 and 884, respectively, forming an active transistor load pair. The resulting output signal at the drains of transistors 882 and 884 then drives inverter 887 completing the single ended signal conversion process. The resulting output signal OUT1 is a rail-to-rail level output signal.

similarly, transistors 891 and 892 are connected to transistors 893 and 894, respectively, forming an active transistor load pair. The resulting signal output at the drains of transistors 892 and 894 then drives inverter 897 completing the single ended signal conversion process. The resulting output signal OUT1B is a rail-to-rail level output signal approximately 180 degrees out of phase with respect to signal OUT1. This is because the gate of transistors 881 and 882 with respect to the gates of transistors 891 and 892 are connected in an opposite manner to input signals O1 and O1B.

Transistors 885, 886, 895, and 896 along with transistors 971, 973, and 977 of second current mirroring stage 902 (FIG. 3E) provide a method for disabling dual amplification stage 811 so that little or no current is consumed by this part of the circuitry in powered down mode.

As in ICO 200, since input transistors 881, 882, 891, and 892 are all p-channel transistors, dual amplification stage 811 and the substrate are limited in their ability to inject noise backwards into delay cell circuitry 811. Therefore, ICO 300 has greater noise immunity and tolerance. Had input transistors 881, 882, 891, and 892 been n-channels these n-channels would be capacitively modulated by their $V_{GS}$ voltage and inject noise into ring oscillator 800.

The present invention has been explained with reference to two preferred embodiments. Other embodiments will be apparent to those skilled in the art in light of this disclosure. For example, the present invention may effectively be used in combination with various currents $I_{in}$ other than that described in the preferred embodiments. Therefore, these and other variations upon the preferred embodiments are intended to be covered by the appended claims.

What is claimed is:

1. A current-controlled p-channel transistor-based ring oscillator circuit receiving a control current, comprising:

a ring oscillator provided with an active switching path having all p-channel transistors;

at least one amplification circuit for providing at least one amplification output clock signal; and means for connecting said ring oscillator to said amplification circuit.

2. The current-controlled oscillator circuit of claim 1, wherein the active switching path of said ring oscillator comprises p-channel transistors forming one or more connected delay cells.

3. The current-controlled oscillator circuit of claim 2, wherein said means for connecting said p-channel transistors forming said delay cells are formed over an n-well.

4. The current-controlled oscillator circuit of claim 2, wherein one of said delay cells receives a skew signal for guaranteeing the beginning of an oscillatory behavior of said ring oscillator.

5. The current-controlled oscillator circuit of claim 1, wherein said amplification circuit includes a p-channel input transistor.

6. The current-controlled oscillator circuit of claim 5, wherein a plurality of said p-channel transistors in said ring oscillator drives a plurality of said p-channel transistors in said amplification circuit.

7. The current-controlled oscillator circuit of claim 6 further comprising a current source having p-channel transistors, said current source providing current to the p-channel transistors of said ring oscillator.

8. The current-controlled oscillator circuit of claim 7, wherein said p-channel transistors in said ring oscillator, in said amplification circuit, and in said current source are formed over an n-well.

9. The current controlled oscillator circuit of claim 1, wherein means for connecting said ring oscillator to said amplification circuit is formed over an n-well.

10. The current-controlled oscillator circuit of claim 1 further comprising:

a first current mirroring stage for receiving said control current and for providing voltage supply for use by said ring oscillator; and a second mirroring stage for receiving an input current and for providing voltage supply for use by said amplification circuits.

11. The current-controlled oscillator circuit of claim 10, wherein said input current is a precision current.

12. The current-controlled oscillator circuit of claim 1, wherein said current-controlled oscillator circuit is for use in a voltage-controlled oscillator.

13. The current-controlled oscillator circuit of claim 12, wherein said voltage-controlled oscillator provides said control current.

* * * * *